United States Patent
Li et al.

(10) Patent No.: US 9,602,058 B1
(45) Date of Patent: Mar. 21, 2017

(54) METHOD AND APPARATUS FOR ENVELOPE TRACKING CALIBRATION

(71) Applicant: Marvell International Ltd., Hamilton (BM)

(72) Inventors: Qiang Li, Austin, TX (US); Alexander Zaslavsky, Petach Tikva (IL); Brian T. Brunn, Bee Cave, TX (US)

(73) Assignee: Marvell International Ltd., Hamilton (BM)

( * ) Notice: Subject to any disclaimer, the term of this patent is extended or adjusted under 35 U.S.C. 154(b) by 0 days.

(21) Appl. No.: 14/833,782

(22) Filed: Aug. 24, 2015

Related U.S. Application Data

(60) Provisional application No. 62/041,865, filed on Aug. 26, 2014.

(51) Int. Cl.
| | |
|---|---|
| H03G 3/20 | (2006.01) |
| H03F 1/02 | (2006.01) |
| H03F 3/19 | (2006.01) |
| H03F 3/21 | (2006.01) |

(52) U.S. Cl.
CPC .......... *H03F 1/0216* (2013.01); *H03F 3/19* (2013.01); *H03F 3/21* (2013.01); *H03F 2200/102* (2013.01); *H03F 2200/451* (2013.01)

(58) Field of Classification Search
CPC ............................ H03F 1/0222; H03F 1/025
USPC .................................................. 330/127, 136
See application file for complete search history.

(56) References Cited

U.S. PATENT DOCUMENTS

2011/0298539 A1* 12/2011 Drogi .................. H03F 1/0227
                                                                  330/129

* cited by examiner

*Primary Examiner* — Steven J Mottola

(57) ABSTRACT

Aspects of the disclosure provide a circuit that includes an envelope processing circuitry and a voltage modulator. The envelope processing circuitry is configured to receive a stream of envelope values of a signal for transmission and output a supply modulation signal in response to the stream of envelope values based on an average-power-tracking (APT) calibration. The voltage modulator is configured to modulate a supply voltage to an amplifier according to the supply modulation signal. The amplifier operates under the supply voltage to amplify the signal for transmission.

16 Claims, 6 Drawing Sheets

US 9,602,058 B1

METHOD AND APPARATUS FOR ENVELOPE TRACKING CALIBRATION

INCORPORATION BY REFERENCE

This present disclosure claims the benefit of U.S. Provisional Application No. 62/041,865, "ENVELOPE TRACKING CALIBRATION" filed on Aug. 26, 2014, which is incorporated herein by reference in its entirety.

BACKGROUND

The background description provided herein is for the purpose of generally presenting the context of the disclosure. Work of the presently named inventors, to the extent the work is described in this background section, as well as aspects of the description that may not otherwise qualify as prior art at the time of filing, are neither expressly nor impliedly admitted as prior art against the present disclosure.

Power supply modulation techniques can be used to reduce power consumption. In an example, a mobile phone uses a power amplifier to amplify a radio frequency signal before transmission. When the power supply to the power amplifier is modulated to track the amplitude of the radio frequency signal, the power consumed and wasted by the power amplifier can be reduced.

SUMMARY

Aspects of the disclosure provide a circuit that includes an envelope processing circuitry and a voltage modulator. The envelope processing circuitry is configured to receive a stream of instantaneous modulation envelope values of a signal for transmission later called as "envelope values" and output a supply modulation signal in response to the stream of envelope values based on an average-power-tracking (APT) calibration. The voltage modulator is configured to modulate a supply voltage to an amplifier according to the supply modulation signal. The amplifier operates under the supply voltage to amplify the signal for transmission.

According to an aspect of the disclosure, the envelope processing circuitry is configured to store a mapping between signal envelope values and supply modulation code associated with the supply voltage, and to generate the supply modulation signal based on the mapping. The mapping is determined based on the average-power-tracking calibration.

Further, in an example, the envelope processing circuitry is configured to store, in a look-up table, a linear mapping between the envelope values and the supply modulation codes. The linear mapping includes a threshold envelope value mapping point of a threshold envelope value to a minimum code associated with a minimum supply voltage. The envelope processing circuitry is configured to compare an envelope value to the threshold envelope value, output the minimum code when the envelope value is lower than the threshold envelope value, and output the supply modulation code according to the linear mapping when the envelope value is higher than the threshold envelope value.

According to an aspect of the disclosure, the circuit includes an envelope tracking calibration controller configured to build a mapping, such as a linear mapping, between envelope and the supply voltage based on the average-power-tracking calibration.

In an embodiment, the average-power-tracking calibration maps at least a first average output power to a first supply voltage, and a second average output power to a second supply voltage, and the envelope tracking calibration controller is configured to determine a first envelope value associated with the first average output power, and a second envelope value associated with the second average output power. Further, in an example, the envelope tracking calibration controller is configured to calculate the first envelope value as a function of a peak to average power ratio (PAPR), and the first average output power and to calculate the second envelope value as a function of the peak to average power ratio (PAPR), and the second average output power. The envelope tracking calibration controller is configured to determine the linear mapping based on a first mapping point of the first envelope value to the first supply voltage, and a second mapping point of the second envelope value to the second supply voltage. Then, the envelope tracking calibration controller is configured to determine a threshold mapping point of a threshold envelope value to a minimum supply voltage based on the linear mapping.

Aspects of the disclosure provide a method for envelope tracking. The method includes receiving, by an envelope processing circuitry, a stream of envelope values of a signal for transmission, generating a supply modulation signal in response to the stream of envelope values based on an average-power-tracking calibration, and modulating a supply voltage to an amplifier in response to the supply modulation signal. The amplifier operates under the supply voltage to amplify the signal for transmission.

BRIEF DESCRIPTION OF THE DRAWINGS

Various embodiments of this disclosure that are proposed as examples will be described in detail with reference to the following figures, wherein like numerals reference like elements, and wherein.

DETAILED DESCRIPTION OF EMBODIMENTS

Figure 1:
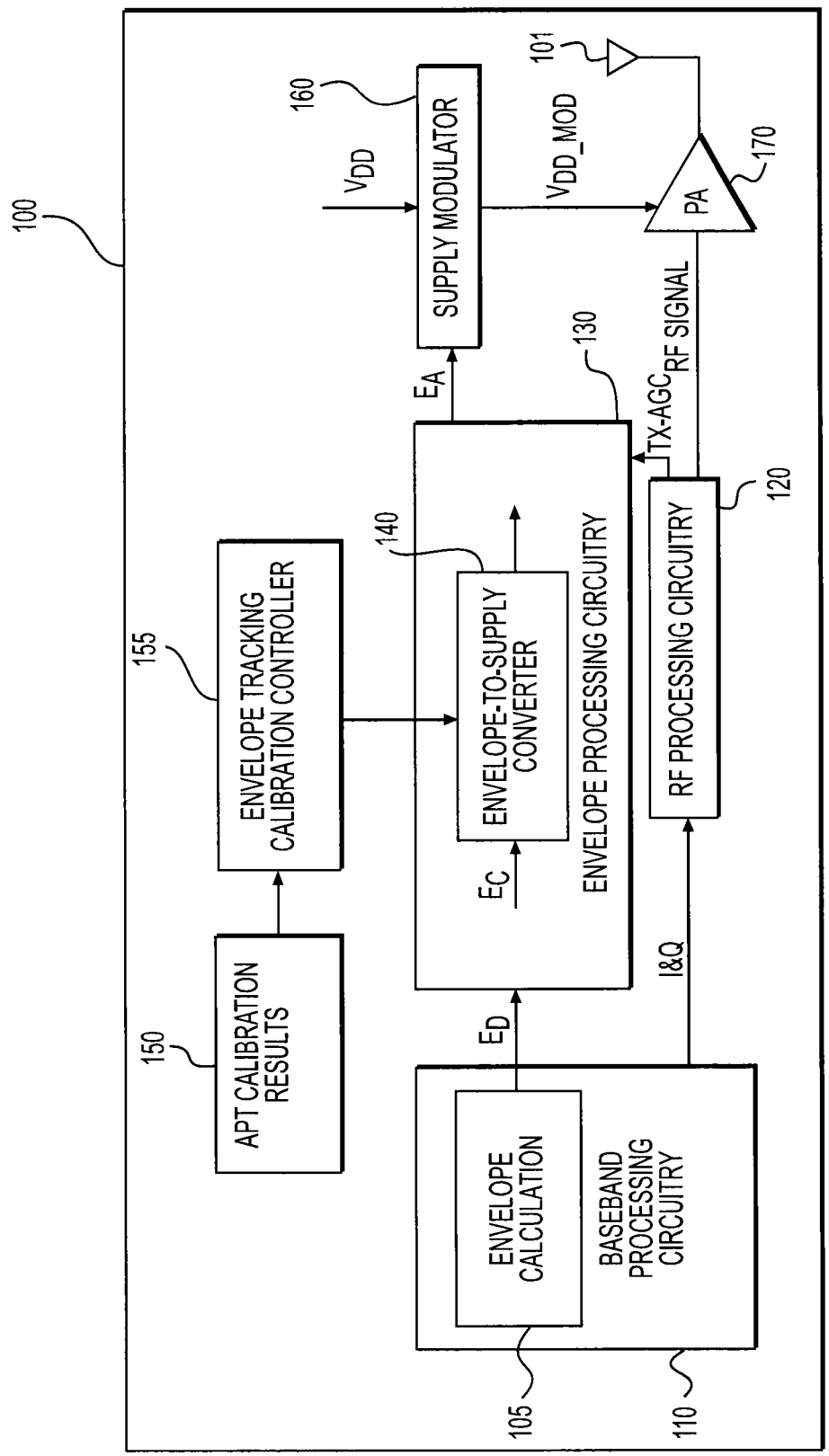
FIG. 1 shows a block diagram of a wireless device 100 according to an aspect of the disclosure.

FIG. 1 shows a block diagram of a wireless device example 100 according to an embodiment of the disclosure. The wireless device 100 includes a baseband processing circuitry 110, a radio frequency (RF) processing circuitry 120, an envelope processing circuitry 130, a power amplifier (PA) 170, a supply modulator 160, and an antenna 101 coupled together as shown in FIG. 1. The envelope processing circuitry 130 is configured to perform a mapping between the envelope values and supply modulation codes based on average-power tracking (APT) calibration and generate a supply modulation signal in response to envelope of a signal for transmission.

The wireless device 100 can be any suitable device, such as a cell phone, a smart phone, a laptop, a tablet, a printing device, an imaging device, a mobile device, a remote controlling device, and the like, that uses electromagnetic waves in the air for wireless communication. The wireless communication can comply with any suitable technology and standard, such as Wi-Fi technology, cellular radio technology, Bluetooth technology, and the like. In an embodiment, the wireless device 100 is a mobile phone that complies with a long-term evolution (LTE) standard for wireless communication of high speed data.

In the FIG. 1 example, the wireless device 100 uses a power supply modulation technique to reduce power consumption. Specifically, in an example, the baseband processing circuitry 110 processes data for transmission in baseband, such as in the form of an in-phase component (I) and a quadrature component (Q) of the data for transmission. In addition, the baseband processing circuitry 110 has an envelope tracking capability to track an envelope of the signal for transmission. In the FIG. 1 example, the baseband processing circuitry 110 includes an envelope calculation circuitry 105 configured to calculate an amplitude based on the in-phase component and the quadrature component to track the envelope of the signal for transmission. The envelope calculation circuit 105 generates a stream of digital values $E_D$ in response to a stream of in-phase components and quadrature components. It is noted that the envelope of the signal for transmission can be tracked by other suitable technique.

Further, the data (e.g., a stream of I and Q values) and the envelope (e.g., the stream of digital values $E_D$) are processed along respective processing paths for respective processing. For example, the RF processing circuitry 120 includes any suitable circuits to generate an RF signal in a radio frequency band to carry the data for transmission. The envelope processing circuitry 130 generates a modulation signal $E_A$ in response to the stream of digital values $E_D$. According to an aspect of the disclosure, the RF processing circuitry 120 and the power amplifier 170 form a transmitting path, and the transmitting path uses an automatic gain control (AGC) technique to provide a power control at the output of the power amplifier 170. In an example, the power control in the transmitting path is adjusted according to a TX_AGC code. The TX_AGC code is calibrated and used to adjust various components (both digital circuits and analog circuits) in the transmitting path, thus the TX_AGC code is indicative of a collective gain in the transmitting path. The TX_AGC code is provided to the envelope processing circuitry 130, such that the envelop values can be gain-corrected based on the collective gain in the transmitting path. In the example, the gain-corrected envelope values for a signal correspond to envelopes at the output of the power amplifier 170 for transmitting the signal, and thus correspond to the output power levels of the power amplifier 170 for transmitting the signal.

The modulation signal $E_A$ can be digital signal or analog signal. The modulate signal $E_A$ is provided to the supply modulator 160. The supply modulator 160 modulates a supply voltage $V_{DD\_MOD}$ based on the modulation signal $E_A$. The modulated supply voltage $V_{DD\_MOD}$ is provided to the power amplifier 170 as the supply voltage. The power amplifier 170 then amplifies the RF signal, and the amplified RF signal is transmitted as electromagnetic waves in the air by the antenna 101. When the modulated supply voltage $V_{DD\_MOD}$ is time-aligned with the envelope of the RF signal, a voltage drop on the power amplifier 170 (e.g., output transistors in the power amplifier 170) is reduced. Thus, the amount of power wasted by the power amplifier 170 is reduced and the power amplifier 170 dissipates less heat.

According to an aspect of the disclosure, in the FIG. 1 example, the envelope processing circuitry 130 includes an envelope-to-supply converter 140 configured to determine a supple voltage level in response to an envelope value based on APT calibration results. In an example, the envelope-to-supply converter 140 includes a gain correction component that performs a gain correction on the envelopes values according to the TX_AGC code in order to match the gain on the transmitting path, and an envelope tracking (ET) mapping between envelope values (e.g., gain-corrected envelope values) and the supply voltage levels. The ET mapping is determined based on the APT calibration results.

In the FIG. 1 example, the wireless device 100 includes a memory circuitry 150 storing average-power-tracking (APT) calibration results, and includes an envelope tracking calibration controller 155 configured to determine the ET mapping between envelope values and supply voltages based on the APT calibration results. The ET mapping is used by the envelope processing circuitry 130 for envelope tracking.

According to an aspect of the disclosure, the ET mapping is a function of various parameters, and is generally determined using an envelope tracking calibration process. In an example, the ET mapping between envelope values and the supply voltages is a function of the power amplifier 170, and is specific to each wireless device 100. For different power amplifier 170, the ET mapping can be different, thus the ET mapping needs to be determined after the power amplifier 170 is coupled with, for example the RF processing circuitry 120. In an example, the power amplifier 170 is implemented on a first integrated circuit (IC) chip, and the RF processing circuitry 120 is implemented on a second IC chip with other suitably circuitry, such as the envelope processing circuitry 130, the baseband processing circuitry 110, and the like. The first and the second IC chips are mounted on a printed circuit board (PCB) and are coupled together during an assembly process that assembles the components together to form the wireless device 100. Then, the wireless device 100 is calibrated and tested before delivery to market.

Various calibrations may need to be performed before delivery. The calibrations may increase a time to market and add cost per-device, thus a time efficient envelope tracking calibration is preferred in an example. According to an aspect of the disclosure, an average-power-tracking (APT) calibration is performed before delivery, and the APT calibration results are stored in the memory circuitry 150. The envelope tracking calibration controller 155 is configured to determine the ET mapping between the envelopes and supply voltages based on the APT calibration results, such that a separate envelope tracking calibration is not needed.

According to an aspect of the disclosure, the APT calibration builds an APT mapping of average output power levels to power supply voltage levels. The average output power levels are determined by averaging output powers of the power amplifier 170 on a time slot by time slot base, thus the supply voltage level changes relatively slowly compared to the signal envelope frequency. In an example, the supply voltage level corresponding to an average output power level is suitably calibrated to be a non-clipping voltage level that is large enough not to distort (clip) the amplified signal, and is approximately corresponding to the peak level of the envelope for the amplified signal in the time slot. Then, in the example, for an APT mapping point in the APT mapping having a supply voltage level associated with an average output power level, the envelope tracking calibration controller 155 determines an ET mapping point in the ET mapping having the supply voltage level associated with an envelope value.

In an example, a suitable peak-to-average power ratios (PAPR) is predetermined. It is noted that PAPR is a function of signal modulation characteristics, and can be predetermined. Based on the PAPR and the average output power level, the peak output power level can be calculated. Further, based on the peak output power level, a corresponding gain-corrected envelope value can be determined.

According to an aspect of the disclosure, the envelope tracking calibration controller 155 determines a linear mapping of envelope values (gain-corrected envelope values) to the supply voltage levels based on the APT mapping. In an example, the envelope tracking calibration controller 155 selects two APT mapping points of different output power levels, and determines two ET mapping points. Based on the two ET mapping points, the envelope tracking calibration controller 155 builds the linear mapping. Further, in an example, the envelope tracking calibration controller 155 determines a threshold mapping point of a threshold envelope to a minimum supply voltage, and stores the two ET mapping points and the threshold mapping point in a look-up table.

Then, the envelope-to-supply converter 140 can determine a supply voltage level corresponding to a received gain-corrected envelope value based on the two ET mapping points and the threshold mapping point in the look-up table. For example, when the received gain-corrected envelope value is lower than the threshold envelope, the envelope-to-supply converter 140 determines the minimum supply voltage in response to the received gain-corrected envelope value; and when the received envelope value is higher than the threshold envelope, the envelope-to-supply converter 140 determines a supply voltage in response to the received gain-corrected envelope value by a linear interpolation based on any two of the ET mapping points in the look-up table.

It is noted that the ET linear mapping can be stored in other suitable format. In an example, one of the ET mapping points and the threshold mapping point can be stored and used in the envelope tracking in the similar manner. In another example, a slope of the linear mapping is calculated, the threshold mapping point and the slope can be stored and used in the envelope tracking in the similar manner.

According to an aspect of the disclosure, the three ET mapping points based linear mapping can achieve more power saving than a related linear mapping. In an example, the related linear mapping is a scale and offset type of linear mapping. The supply voltage is calculated as a linear function of the envelope based on a scale and an offset. In the example, the related linear mapping is linear over all the envelope values, thus does not closely follow the envelope near the minimum supply voltage, and can cause current penalty. In addition, the related linear mapping requires manual tuning and experience in an envelope tracking calibration. The three ET mapping points based linear mapping closely follows the envelope in the supply voltage range, and achieves more power saving.

It is noted that the envelope tracking calibration controller 155 and the envelope-to-supply converter 140 can be implemented using integrated circuits, or can be implemented as a processing circuitry executing software instructions.

It is also noted that envelope tracking calibration controller 155 can be an internal component to the wireless device 100 or can be an external component that is coupled to the wireless device 100 during a calibration procedure.

Figure 2:
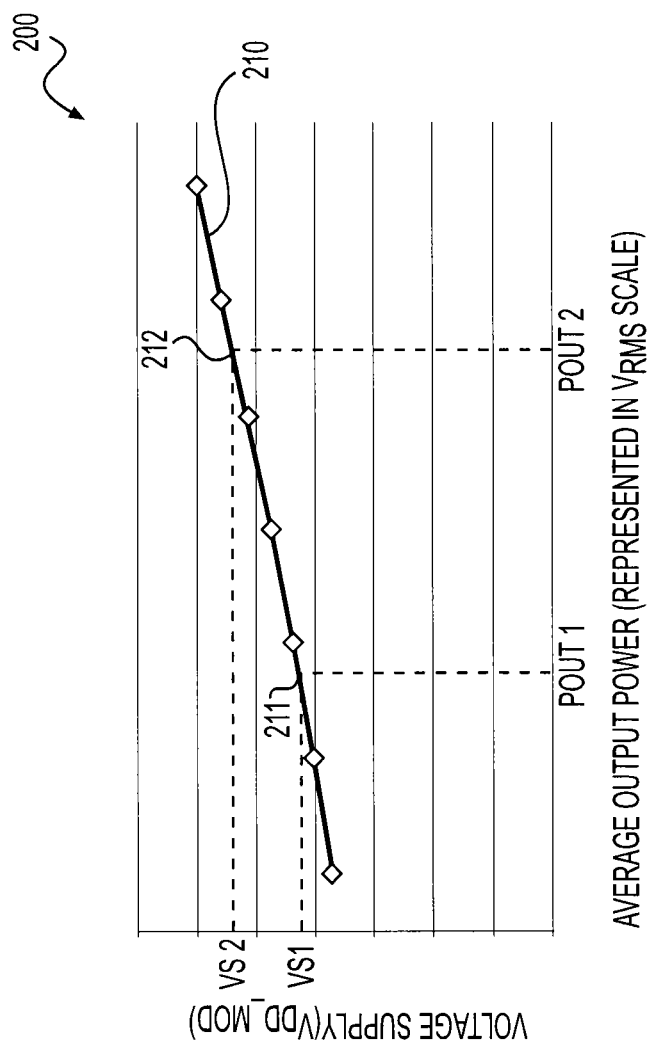
FIG. 2 shows a plot 200 for using average-power-tracking (APT) calibration results in envelope tracking according to an aspect of the disclosure.

FIG. 2 shows a plot 200 for using average-power-tracking (APT) calibration results in envelope tracking according to an aspect of the disclosure. The plot 200 shows an APT mapping 210 of average output power levels (X-axis) to supply voltage levels (Y-axis). It is noted that the average output power levels are represented in root-mean-square of voltage ($V_{RMS}$) scale.

In the FIG. 2 example, two APT mapping points 211 and 212 are selected. The first mapping point 211 maps a first average output power POUT1 to a first supply voltage VS1, and the second mapping point 212 maps a second average output power POUT2 to a second supply voltage VS2.

According to an aspect of the disclosure, when adjacent channel leakage ratio (ACLR) target is about the same, envelope tracking supply voltage level for a peak voltage point in a time slot is about the same level as the supply voltage level for the same average power in the APT tracking for the time slot in an example.

In an example, based on the peak-to-average power ratio (PAPR) and the first average output power POUT1, the envelope tracking calibration controller 155 can determine the peak output power in a first time slot. Based on the peak output power and the gain of the power amplifier 170, the envelope tracking calibration controller 155 can determine a first gain corrected envelope value $E_C1$ corresponding to POUT1 in the first time slot. Similarly, based on the peak-to-average power ratio (PAPR), and the second average output power POUT2, the envelope tracking calibration controller 155 can determine a second gain-corrected envelope value $E_C2$ of the input signal corresponding to POUT2 in a second time slot.

Then, the first voltage supply VS1 and the first envelope value $E_C1$ form a first ET mapping point in the ET mapping, and the second supply voltage VS2 and the second envelope value $E_C2$ form a second ET mapping point in the ET mapping. Based on the first ET mapping point and the second ET mapping point, a linear ET mapping of the envelope to the supply voltage can be built.

Further in an example, a minimum supply voltage is respectively determined for each frequency band, and a threshold envelope associated with the minimum supply voltage is calculated based on the ET linear mapping.

Figure 3:
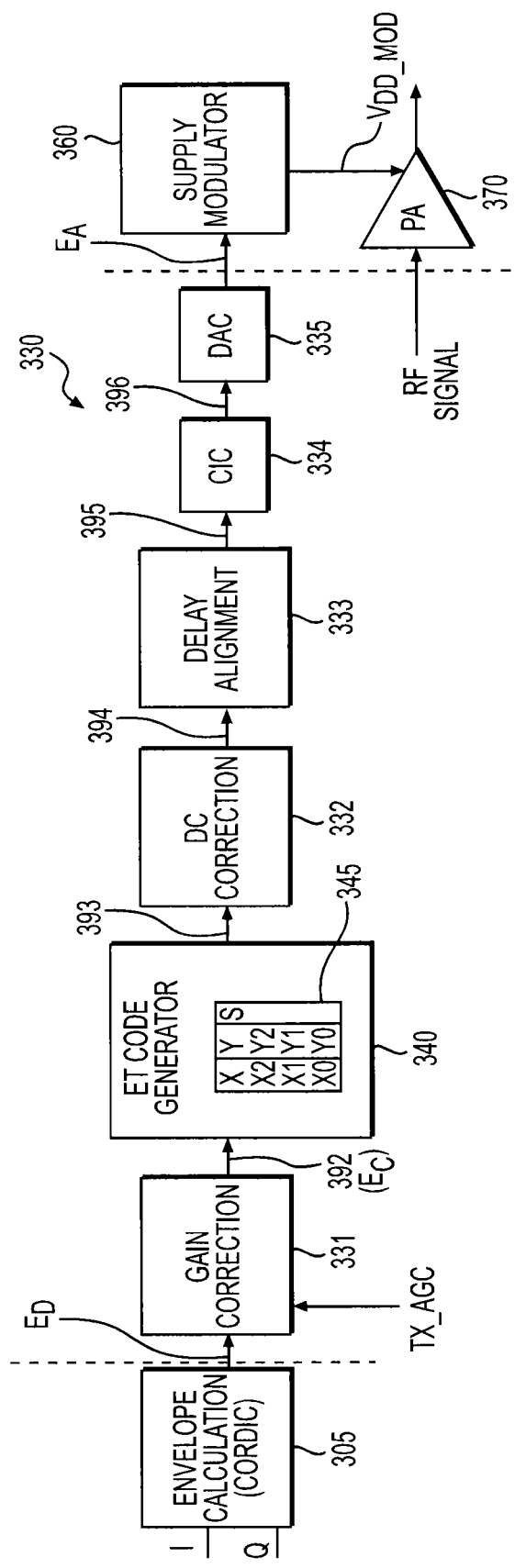
FIG. 3 shows a block diagram of an envelope processing circuitry 330 according to an aspect of the disclosure.

FIG. 3 shows a block diagram of an envelope processing circuitry 330 according to an aspect of the disclosure. In an example, the envelope processing circuitry 330 is used in the wireless device 100, for example in the place of the envelope processing circuitry 130. The envelope processing circuitry 330 is driven by an envelope calculation circuit 305, and includes a gain correction circuit 331, an envelope tracking code generator 340, a DC correction circuit 332, a delay alignment circuit 333, a filter circuit 334, a digital to analog converter (DAC) 335 coupled together as shown in FIG. 3.

The envelope calculation circuit 305 is configured to receive an in-phase component (I) and a quadrature component (Q) of data for transmission, and calculate an envelope $E_D$ of signal for transmission as a function of the in-phase component and the quadrature component, for example, using Eq. 1:

$$E_D = \sqrt{I^2 + Q^2} \qquad \text{Eq. 1}$$

In an example, the envelope calculation circuit 305 is implemented according to coordinate rotation digital computer (CORDIC) method to calculate the envelope $E_D$.

The gain correction circuit 331 receives a TX_AGC code from a transmitting path, such as the RF processing circuitry 120 in the FIG. 1 example. The TX_ACG code is indicative of a collective gain in the transmitting path. According to the TX_AGC code in the RF processing circuitry, the gain correction circuit 331 adjusts the envelope value with matching gain to the transmitting path to output gain-corrected envelope 392 ($E_C$).

The envelope tracking code generator 340 is configured to generate a supply modulation code in response to the gain-corrected envelope 392. The supply modulation code can be used to control supply modulation. In the FIG. 3 example, the envelope tracking code generator 340 includes a look-up table 345 storing three ET mapping points that define a linear ET mapping between supply modulation codes (Y) and envelope values (X), and is configured to generate a supply modulation code 393 in response to a gain-corrected envelope 392 based on the linear ET mapping. In an example, the supply modulation codes are defined to be indicative of the supply voltage levels. For example, the supply modulation codes are defined to be linear to the supply voltage levels.

In the FIG. 3 example, the look-up table 345 stores a first ET mapping point (X1, Y1), a second ET mapping point (X2, Y2), and a threshold ET mapping point (X0, Y0). Any two of the points, such as the first ET mapping point and the second ET mapping point, define the linear mapping. The threshold ET mapping point defines a threshold envelope (X0) with a supply modulation code (Y0) associated with the minimum supply voltage. In an example, the envelope tracking code generator 340 compares the gain corrected envelope 392 with the threshold envelope X0. When the gain corrected envelope 392 is lower than or equal to the threshold envelope X0, the envelope tracking code generator 340 outputs the supply modulation code Y0. When the gain corrected envelope 392 is higher than the threshold envelope X0, the envelope tracking code generator 340 uses linear interpolation to determine a supply modulation code in response to the gain corrected envelope 392.

It is noted that the ET linear mapping can be stored in other suitable manner. In an example, the threshold ET mapping point and one of the first ET mapping point and the second ET mapping point are stored. In another example, the threshold ET mapping point and a slope (S) of the ET linear mapping are stored.

The DC correction circuit 332 is configured to perform DC correction on the supply modulation code 393, and output DC corrected supply modulation code 394.

The delay alignment circuit 333 is configured to suitably adjust delay of the DC corrected supply modulation code 394 to time-align the envelope processing circuitry 330 with a RF processing circuitry that generates the RF signal for amplifying and transmission. The delay alignment circuit 333 outputs delayed supply modulation code 395.

In the FIG. 3 example, the filter 334 is a cascaded integrator-comb (CIC) type filter configured to increase a sample rate and filter a stream of supply modulation codes based on a cascaded integrator-comb filter topology to generate filtered supply modulation code 396.

The DAC 335 is configured to convert the filtered supply modulation code 396 into an analog modulation signal $E_A$. The analog modulation signal $E_A$ is provided to a supply modulator 360 to modulate a supply voltage $V_{DD\_MOD}$. The supply voltage $V_{DD\_MOD}$ is provided to a power amplifier 370.

According to an aspect of the disclosure, the linear ET mapping in FIG. 3 is determined based on APT calibration results. For example, the APT calibration results map average output power level (POUT) (in dBm) to supply modulation code (Y). In an example, two APT mapping points (22, Y2) and (17, Y1) are selected, and used to determine the ET mapping points (X2, Y2) and (X1, Y1).

Figure 4:
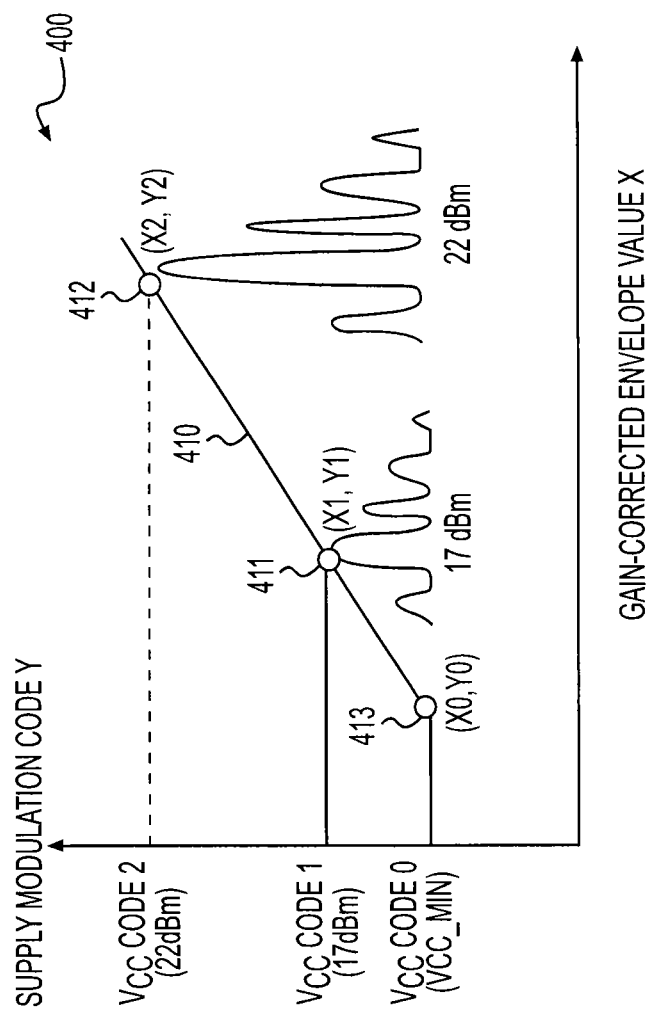
FIG. 4 shows a plot 400 for using average-power-tracking (APT) calibration results in envelope tracking according to an aspect of the disclosure.

FIG. 4 shows a plot 400 for building linear ET mapping based on APT calibration results according to an aspect of the disclosure. In an example, the APT calibration maps average output power levels to supply modulation codes. According to the APT calibration results, two APT mapping points, such as (17 dBm, Y1) and (22 dBm, Y2) are selected. It is noted that other suitable APT mapping points can be used in the similar manner. The first APT mapping point (17 dBm, Y1) maps average output power level 17 dBm to a first supply modulation code Y1, and the second APT mapping point (22 dBm, Y2) maps average output power level 22 dBm to a second supply modulation code.

Based on the average output power level 17 dBm, and the peak-to-average power ratio (PAPR), a gain-corrected envelope value X1 is calculated. Based on the average output power level 22 dBm, and the peak-to-average power ratio (PAPR), the gain-corrected envelope value X2 is calculated. Then, a first ET mapping point (X1, Y1) as shown by 411 and a second ET mapping point (X2, Y2) as shown by 412 are formed to define a linear ET mapping as shown by 410.

Further, in the FIG. 4 example, the minimum supply voltage (VCC_MIN) for the frequency band under calibration is determined, and a supply modulation code Y0 to generate the minimum supply voltage is determined. According to the linear ET mapping, a threshold envelope X0 corresponding to the supply modulation code Y0 is determined. The supply modulation code Y0 and the threshold envelope X0 form the threshold mapping point (X0, Y0) as shown by 413.

Figure 5:
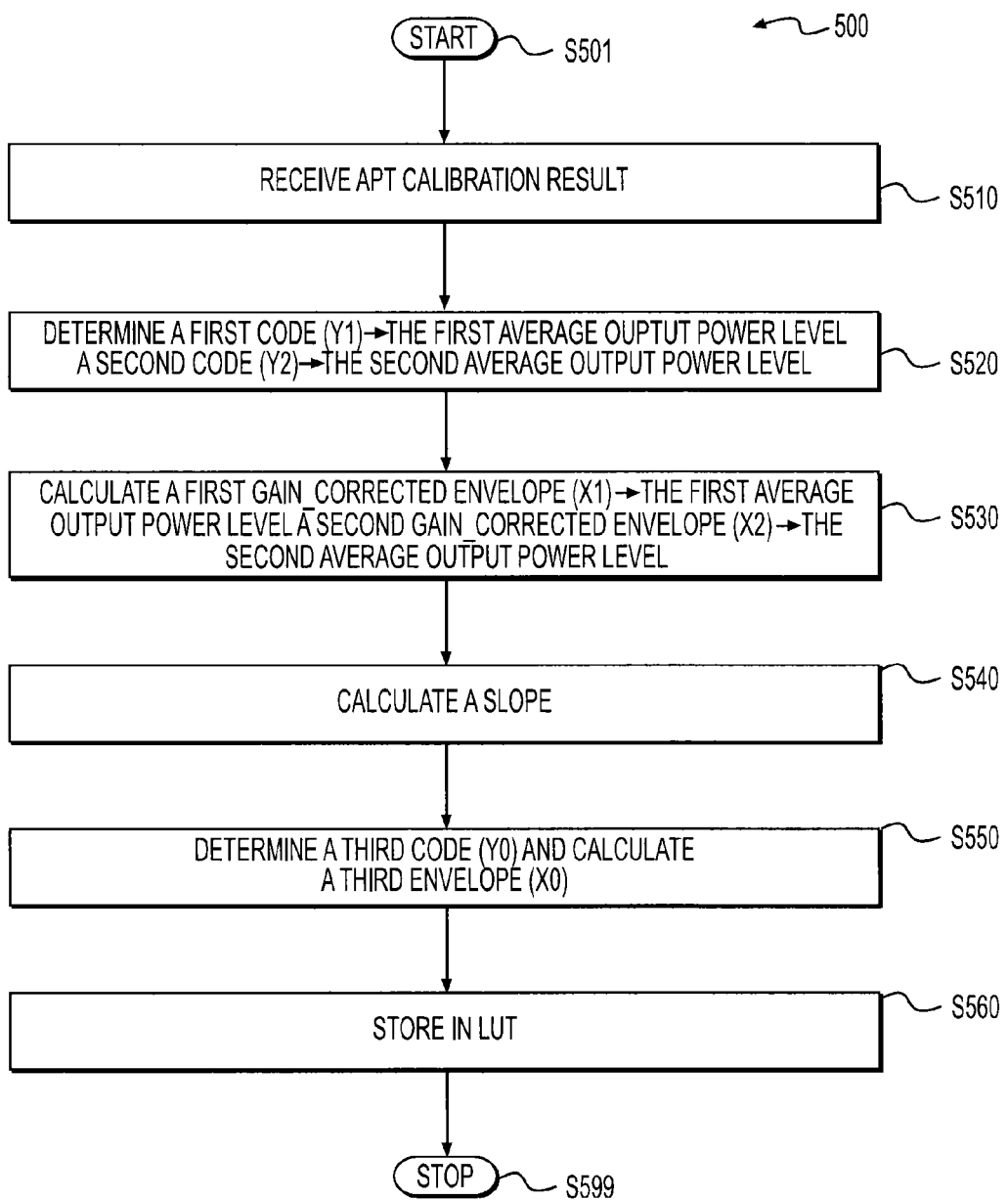
FIG. 5 shows a flow chart outlining a process 500 to determine a mapping for an envelope tracking according to an aspect of the disclosure.

FIG. 5 shows a flow chart outlining a process 500 to build a linear mapping for envelope tracking calibration according to an aspect of the disclosure. In an example, the process 500 is executed by an envelope tracking calibration controller, such as the envelope tracking calibration controller 155 in the wireless device 100. The process starts at S501, and proceeds to S510.

At S510, the envelope tracking calibration controller receives APT calibration results. In an example, the APT calibration results map average output power levels to supply modulation codes.

At S520, according to the APT calibration results, the envelope tracking calibration controller determines a first supply modulation code (Y1) corresponding to a first average output power level (e.g., 17 dBm) and a second supply modulation code (Y2) corresponding to a second average power level (e.g., 22 dBm).

At S530, the envelope tracking calibration controller calculates a first gain-corrected envelope (e.g., X1) corresponding to the first average output power level and calculates a second gain-corrected envelope (e.g., X2) corresponding to the second average output power level. In an example, the envelope tracking calibration controller calculates the peak output power levels based on the average output power levels and PAPR, and then converts the peak output power levels to corresponding gain-corrected envelopes.

At S540, the envelope tracking calibration controller calculates a slope based on the first ET mapping point (X1, Y1) and the second ET mapping point (X2, Y2).

At S550, the envelope tracking calibration controller determines a supply modulation code Y0 associated with a minimum supply voltage, and calculates a threshold envelope X0 based on the linear ET mapping. The supply modulation code Y0 and the threshold envelope X0 form a threshold ET mapping point.

At S560, the envelope tracking calibration controller stores the linear ET mapping. In an example, the linear ET mapping is stored in the format of threes ET mapping points (the first ET mapping point, the second ET mapping point and the threshold ET mapping point) in a look-up table. In another example, the linear ET mapping is stored in the format of the threshold ET mapping point and the slope. Then, the process proceeds to S599 and terminates.

It is noted that the process 500 can be suitably modified. For example, the first and second average output power levels can be pre-selected and the gain-corrected envelops can be pre-calculated.

Figure 6:
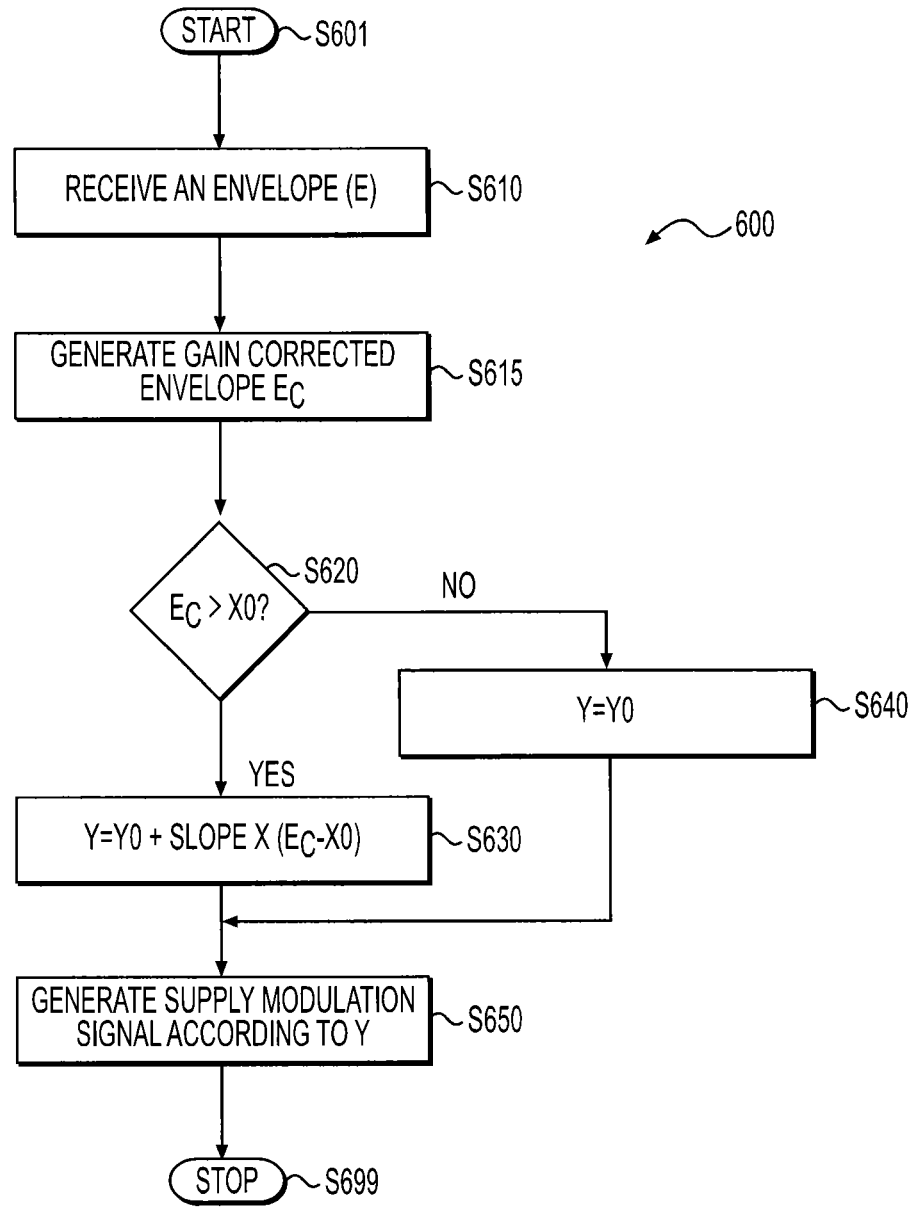
FIG. 6 shows a flow chart outlining a process 600 for envelope tracking according to an aspect of the disclosure.

FIG. 6 shows a flow chart outlining a process 600 for envelope tracking according to an aspect of the disclosure. In an example, the process is executed in an envelope processing circuitry, such as the envelope processing circuitry 130, the envelope processing circuitry 330, and the like. The envelope processing circuitry includes a linear ET mapping that maps envelopes to supply modulation codes that control supply voltage modulation. In an example, the linear ET mapping is defined using a threshold mapping point and a slope of the linear mapping. The threshold mapping point maps a threshold envelope to a minimum supply modulation code associated with a minimum supply voltage. The process starts at S601 and proceeds to S610.

At S610, an envelope value is received. In an example, the envelope value is calculated based on an in-phase component and a quadrature component of a signal for transmission.

At S615, the envelope value is gain-corrected. In an example, the envelope value is amplified according to a TX_AGC code in a transmitting path to match the gain in the transmitting path.

At S620, the gain-corrected envelope value is compared with a threshold envelope. When the gain-corrected envelope value is larger than the threshold envelope, the process proceeds to S630; otherwise, the process proceeds to S640.

At S630, a supply modulation code is generated in response to the received envelope based on the linear ET mapping. In an example, the slope and the threshold ET mapping point are used to determine the supply modulation code in response to the received envelope.

At S640, the minimum supply modulation code is output as the supply modulation code.

At S650, a supply modulation signal is generated according to the supply modulation code. In an example, an analog supply modulation signal is generated according to the digital supply modulation code. The analog supply modulation signal is provided to a supply modulator, such as the supply modulator 160, to modulate a supply voltage to a power amplifier, such as the power amplifier 170. Then the process proceeds to S699 and terminates.

When implemented in hardware, the hardware may comprise one or more of discrete components, an integrated circuit, an application-specific integrated circuit (ASIC), etc.

While aspects of the present disclosure have been described in conjunction with the specific embodiments thereof that are proposed as examples, alternatives, modifications, and variations to the examples may be made. Accordingly, embodiments as set forth herein are intended to be illustrative and not limiting. There are changes that may be made without departing from the scope of the claims set forth below.

What is claimed is:

1. A circuit, comprising:
an envelope tracking calibration controller that is configured to build a mapping between envelope and supply modulation code associated with a supply voltage that is determined based on an average-power-tracking calibration;
an envelope processing circuitry configured to receive a stream of envelope values of a signal for transmission and output a supply modulation signal in response to the stream of envelope values based on the mapping; and
a voltage modulator configured to modulate the supply voltage to an amplifier according to the supply modulation signal, the amplifier operating under the supply voltage to amplify the signal for transmission.

2. The circuit of claim 1, wherein the envelope processing circuitry is configured to store, in a look-up table, a linear mapping between the envelope and the supply modulation code that includes a threshold envelope mapping point of a threshold envelope to a minimum code associated with a minimum supply voltage.

3. The circuit of claim 2, wherein the envelope processing circuitry is configured to compare an envelope value to the threshold envelope, output the minimum code when the envelope value is lower than the threshold envelope, and output the supply modulation code according to the linear mapping when the envelope value is higher than the threshold envelope.

4. The circuit of claim 1, wherein
the envelope tracking calibration controller is configured to build a linear mapping between the envelop and the supply voltage based on the average-power-tracking calibration; and
the envelope processing circuitry is configured to generate the supply modulation signal based on the linear mapping.

5. The circuit of claim 4, wherein the average-power-tracking calibration maps at least a first supply voltage to a first average output power, and a second supply voltage to a second average output power, and the envelope tracking calibration controller is configured to determine a first envelope value associated with the first average output power, and a second envelope value associated with the second average output power.

6. The circuit of claim 5, wherein the envelope tracking calibration controller is configured to calculate the first envelope value as a function of a peak to average power ratio (PAPR) and the first average output power.

7. The circuit of claim 5, wherein
the envelope tracking calibration controller is configured to determine the linear mapping based on a first mapping point of the first envelope value to the first supply voltage, and the second mapping point of the second envelope value to the second supply voltage.

8. The circuit of claim 7, wherein
the envelope tracking calibration controller is configured to determine a threshold mapping point of a threshold envelope value to a minimum supply voltage based on the linear mapping.

9. A method for envelope tracking, comprising:
receiving, by an envelope processing circuitry, a stream of envelope values of a signal for transmission;
building a mapping between envelope and the supply voltage based on an average-power-tracking calibration;
generating a supply modulation signal in response to the stream of envelope values based on the mapping; and modulating a supply voltage to an amplifier in response to the supply modulation signal, the amplifier operating under the supply voltage to amplify the signal for transmission.

10. The method of claim 9, wherein storing the mapping between the envelope and the supply modulation code associated with the supply voltage further comprises:

storing, in a look-up table, a linear mapping between the envelope and the supply modulation code that includes a threshold mapping point of a threshold envelope value to a minimum code associated with a minimum supply voltage.

11. The method of claim 10, further comprising:

comparing an envelope value to the threshold envelope value;

outputting the minimum code for generating the supply modulation signal when the envelope value is lower than the threshold envelope value; and outputting a supply modulation code based on the linear mapping when the envelope value is higher than the threshold envelope value.

12. The method of claim 9, wherein building a linear mapping between the envelop and the supply voltage based on the average-power-tracking calibration; and generating the supply modulation signal based on the linear mapping.

13. The method of claim 12, wherein the average-power-tracking calibration maps at least a first supply voltage to a first average output power, and a second supply voltage to a second average output power, and the method further comprises:

determining a first envelope value associated with the first average output power, and a second envelope value associated with the second average output power.

14. The method of claim 13, further comprising:

calculating the first envelope value as a function of a peak to average power ratio (PAPR) and the first average output power.

15. The method of claim 13, further comprising:

determining the linear mapping based on a first mapping point of the first envelope value to the first supply voltage, and the second mapping point of the second envelope value to the second supply voltage.

16. The method of claim 15, wherein determining a threshold mapping point of a threshold envelope value to a minimum supply voltage based on the linear mapping.

* * * * *